(12) United States Patent
Li et al.

(10) Patent No.: US 7,229,903 B2
(45) Date of Patent: Jun. 12, 2007

(54) RECESSED SEMICONDUCTOR DEVICE

(75) Inventors: Hsin-Hua P. Li, Scottsdale, AZ (US);
Bruce M. Green, Gilbert, AZ (US);
Olin L. Hartin, Phoenix, AZ (US);
Ellen Y. Lan, Chandler, AZ (US);
Charles E. Weitzel, Mesa, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 24 days.

(21) Appl. No.: 10/925,855

(22) Filed: Aug. 25, 2004

(65) Prior Publication Data

US 2006/0043416 A1 Mar. 2, 2006

(51) Int. Cl.
*H01L 21/28* (2006.01)
*H01L 21/44* (2006.01)

(52) U.S. Cl. .............. 438/571; 438/572; 438/573; 438/574; 438/576

(58) Field of Classification Search ........ 257/155, 257/192, 194, 195, 471–473, 475; 438/167, 438/172, 175, 182, 571–579
See application file for complete search history.

(56) References Cited

U.S. PATENT DOCUMENTS

| | | | |
|---|---|---|---|
| 4,615,102 A * | 10/1986 | Suzuki et al. ............ 438/172 |
| 4,984,036 A | 1/1991 | Sakamoto et al. |
| 6,242,766 B1 * | 6/2001 | Tateno ................. 257/194 |
| 6,586,813 B2 | 7/2003 | Nagahara |
| 6,627,473 B1 * | 9/2003 | Oikawa et al. ........... 438/46 |
| 6,720,200 B2 * | 4/2004 | Yamaguchi et al. ....... 438/47 |
| 6,838,325 B2 * | 1/2005 | Whelan et al. .......... 438/172 |
| 2003/0057440 A1 * | 3/2003 | Inai et al. ............. 257/192 |

OTHER PUBLICATIONS

Wakejima, Akio; "A GaAs-Based Field-Modulating Plate HFET with Improved WCDMA Peak-Output-Power Characteristics"; IEEE Transactions on Electro Devices; Sep. 2003; pp. 1983-1987; vol. 50, No. 9; IEEE.
U.S. Appl. No. 10/716,955, filed Nov. 18, 2003.
U.S. Appl. No. 10/881,162, filed Jul. 13, 2004.

* cited by examiner

*Primary Examiner*—Thien F Tran
(74) *Attorney, Agent, or Firm*—Kim-Marie Vo (57) ABSTRACT

A semiconductor structure includes a first semiconductor layer, a second semiconductor layer over the first semiconductor layer, a third semiconductor layer over the second semiconductor layer, and a fourth semiconductor layer over the third semiconductor layer. A first conductive portion is coupled to the first semiconductor layer, and a second conductive portion is formed over the first semiconductor layer.

12 Claims, 8 Drawing Sheets

RECESSED SEMICONDUCTOR DEVICE

BACKGROUND

1. Field

The present invention relates to semiconductors, and, more particularly, to semiconductor devices in integrated circuits.

2. Description of the Related Art

Microwave transistors are required to operate at ever-increasing frequencies with increased demands on power handling capability. For example, transistors that operate in frequency ranges in the multiple GHz range at voltages well in excess of twenty volts are increasingly needed. Compound semiconductors that combine more than one kind of atom in the semiconductor material from groups III-V or II-VI of the periodic table of elements are the material system of choice for high frequency, high efficiency communication applications. In contrast to compound semiconductors, semiconductors that utilize silicon are more frequently used. However, silicon-based semiconductors are limited in frequency range of operation due to inherent electron transport properties of silicon. A known transistor that has a silicon substrate is the silicon LDMOS (Lateral Double-Diffused Metal Oxide Semiconductor) transistor. While typical LDMOS transistors are able to operate with bias voltages well in excess of twenty volts, such transistors are limited to frequencies no greater than the low GHz range (e.g. up to 3 GHz). As a result, the operating efficiency of known LDMOS transistors is less than desired for many modern communication systems. Therefore, others have focused on extending the operating voltage of compound semiconductor devices.

One proposed compound semiconductor device utilizes a structure known as a step gate transistor. A common feature of a step gate transistor is a gate having two regions at the same potential near the channel. A first region forms a Schottky junction to the channel region. A second region is an extension of a gate extending toward a drain over a dielectric region. Another compound semiconductor device utilizes a field-plate transistor, which has a gate with two regions at arbitrary potentials near the channel.

In both devices, significant depletion of the semiconductor surface between the Schottky junction and the drain occurs. While some known step gate and field plate transistors operate at voltages above twenty volts, such transistors operate at a low power density and low efficiency. Because of such limitations of compound semiconductor devices, LDMOS transistors are typically commercially used more prevalently for microwave applications than compound semiconductor devices. However, it is desirable to use a step gate or field plate transistor and gain the advantages of such a device for high voltage applications. Therefore, a need exists for a step gate or a field plate transistor that can be used for high voltage applications.

BRIEF DESCRIPTION OF THE DRAWINGS

Various embodiments of the present invention are illustrated by way of the accompanying exemplary drawings.

The use of the same reference symbols in different drawings indicates similar or identical items. Also, those of ordinary skill in the art will appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE PREFERRED EMBODIMENT(S)

The following discussion is intended to provide a detailed description of at least one example of the invention and should not be taken to be limiting of the invention itself. Rather, any number of variations may fall within the scope of the invention, which is properly defined in the claims, following this description.

A semiconductor structure includes a first semiconductor layer, a second semiconductor layer over the first semiconductor layer, a third semiconductor layer over the second semiconductor layer, a fourth semiconductor layer over the third semiconductor layer, a first conductive portion coupled to the first semiconductor layer; and a second conductive portion over the first semiconductor layer. The second semiconductor layer may be thinner than the third semiconductor layer. In one embodiment, the second semiconductor layer has a first length, the third semiconductor layer has a second length, wherein the second length is less than the first length, and the fourth semiconductor layer has a third length, wherein the third length is less than the second length. In one embodiment, the second semiconductor layer includes a first recess layer, the third semiconductor layer includes a second recess layer, and the fourth semiconductor layer includes a third recess layer.

In one embodiment, the second conductive portion is physically isolated from the first recess layer, the second recess layer, and the third recess layer. In one form, the second conductive portion is electrically isolated from the first recess layer. In one embodiment, the first conductive portion includes a control electrode and the second conductive portion includes a field plate. In another embodiment, the first conductive portion and the second conductive portion are coupled together. The first and second conductive portions may be portions of the same structure. A more detailed understanding can be gained from the figures and their associated description.

Figure 1:
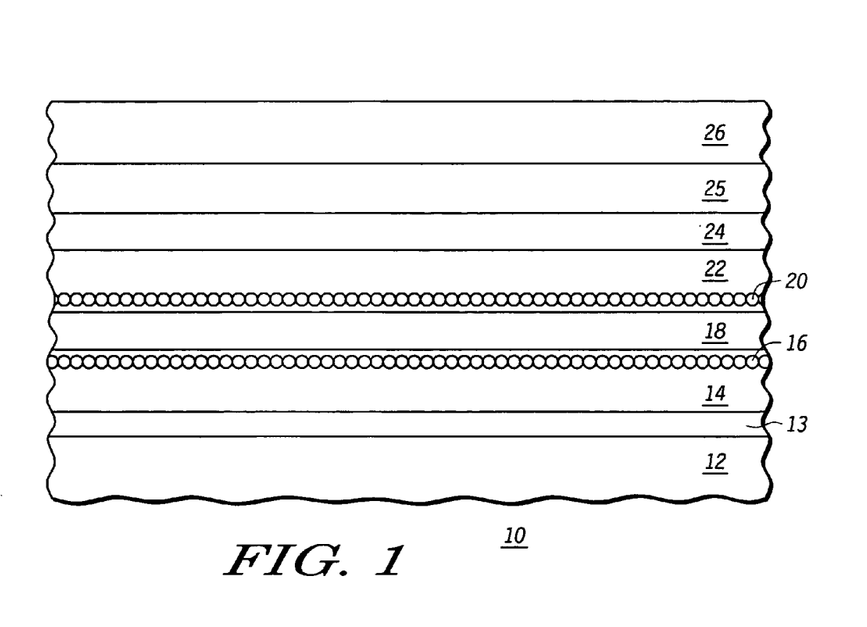
FIGS. 1–9 illustrate in cross-sectional form a process for forming a recessed, step-gate, high voltage tolerant transistor and associated structures.

Illustrated in FIG. 1 is a cross-section of an (incomplete) transistor 10 in accordance with the present invention. A process for forming the transistor 10 is illustrated by the progression of FIGS. 1–9. The transistor 10 is exemplary of a variety of transistors, such as microwave field effect transistors and pseudo-morphic high electron mobility transistors.

A substrate 12 is provided wherein the substrate is preferably formed of GaAs. In other forms, it should be understood that the substrate 12 may be formed of any material that is a compound semiconductor material system such as InP, GaN, the like, and combinations of the above.

Overlying the substrate 12 is a buffer layer 13. In one form, the buffer layer 13 is formed of a plurality of alternating material layers or a single material. Buffer layers overlying GaAs substrates are well documented in the literature. In addition, the buffer layers 13 can be materials that are graded from one to another.

Overlying the buffer layer 13 is a backside barrier layer 14. In one form, the backside barrier layer 14 is formed of $Al_xGa_{1-x}As$, although other compound semiconductor materials may be used, such as $Al_xGa_{1-x}N$ or $In_xGa_{1-x}P$. Here "x" refers to the aluminum mole fraction and has a value between zero and one. Near the interface between the backside barrier layer 14 and an overlying channel layer 18 is a lower planar doping layer 16. The lower planar doping layer 16 has one or several atomic layers of dopant atoms.

The overlying channel layer 18 is formed of Indium Gallium Arsenide ($In_xGa_{1-x}As$) where "x" refers to the indium mole fraction and ranges between zero and one. $In_xGa_{1-x}As$ is a particularly advantageous material for use in the channel of the transistor 10. In particular, $In_xGa_{1-x}As$ is a material having a smaller bandgap and higher electron mobility than the $Al_xGa_{1-x}As$, which is a preferred material for the backside and frontside barrier layers 14 and 22. The speed enhancement from this higher mobility is particularly advantageous as compared with previously used doped GaAs transistor channels. It should be understood that materials other than $In_xGa_{1-x}As$ may be used. For example, for a GaN based transistor, $In_xGa_{1-x}N$ may be used for the channel material. The interface between the channel layer 18 and the backside barrier layer 14 forms a first heterojunction on the substrate 12.

Overlying the channel layer 18 is a barrier layer 22. The barrier layer 22, in one form, is composed of $Al_xGa_{1-x}As$. Other materials from Groups III-V may be used for the barrier layer 22, such as $In_xGa_{1-x}P$ or $Al_xGa_{1-x}N$. Within the barrier layer 22 is an upper planar doping layer 20 that has one or more atomic layers of dopant atoms. The upper planar doping layer 20 forms a second heterojunction with an upper surface of the channel layer 18. Dopant atoms within each of the lower planar doping layer 16 and the upper planar doping layer 20 may be any of silicon, selenium, and tellurium, as well as other materials. With doping on either side of the channel layer 18, during operation electrons from the dopant atoms are thermally excited and enter the channel layer 18 since the channel layer 18 is a region with a lower conduction band energy.

Overlying the barrier layer 22 is a Not Intentionally Doped (NID) layer 24 overlying the second heterojunction. The NID layer 24 functions as a third recess layer because in subsequent processing the NID layer 24 will be the third layer within the transistor 10 to be selectively recessed. As used herein, a recess is a gap in a layer. A recess layer is a layer with a recess or gap therein, wherein the layer is "recessed" from the location previously covered by the layer before the presence of the gap. In one form, the NID layer 24 is formed of GaAs. The backside barrier layer 14, the channel layer 18, and the barrier layer 22 with the upper planar doping layer 20 and the lower planar doping layer 16 form a double heterojunction. The backside barrier layer 14 and the barrier layer 22 each function as a cladding layer.

Overlying NID layer 24 is a layer 25. The layer 25 functions as a second recess layer because in subsequent processing the layer 25 will be the second layer within the transistor 10 to be selectively recessed. In one form, the NID layer 25 is formed of lightly doped GaAs. In another form, layer 25 is another NID layer, which may be GaAs.

Overlying the layer 25 is a first recess layer 26. The first recess layer 26 will subsequently be the first layer within the transistor 10 to be selectively recessed, which in one embodiment occurs by etching. In one form, the first recess layer 26 is a heavily doped semiconductor layer such as N-type GaAs. In one embodiment, an n-type doping concentration of $5 \times 10^{18}$ atoms/cm$^3$ is used. With subsequent processing some of the doping from the first recess layer 26 will, to some degree, diffuse into the layer 25 so that the layer 25 ultimately will, to some degree, become lightly doped. Other materials, such as any semiconductor layer from Group III-V may be used for the first recess layer 26. The first recess layer 26 will later provide an improved ohmic contact to the channel layer 18 of the transistor 10 and is used to form source and drain regions of transistor 10. It should be understood that each of the layers illustrated in FIG. 1 may be formed by techniques such as MBE (Molecular Beam Epitaxy), MOCVD (Metal Organic Chemical Vapor Deposition) in a reactor, the like, or combinations of the above.

Figure 2:
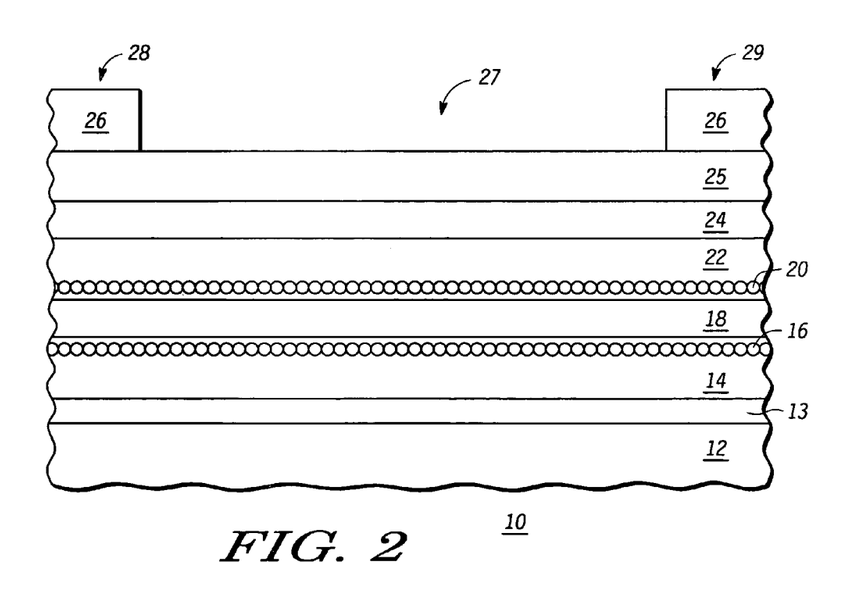

Illustrated in FIG. 2 is further processing of the transistor 10 wherein a first recess 27 is formed within the first recess layer 26. The first recess 27 is typically formed by conventional wet chemical etching technology. The first recess 27 divides the first recess layer 26 into two portions, each corresponding to one of a source region 28 and a drain region 29. The first recess 27 extends from the source region 28 to the drain region 29 of the transistor 10. The width of the first recess 27 is chosen to provide adequate breakdown voltage, BVGDO (Breakdown Voltage of Gate/Drain in the Off state), of the transistor 10 while not degrading the transistor performance, which occurs if the width is too great. In one embodiment, the width of the first recess 27 is approximately two to eight microns.

Figure 3:
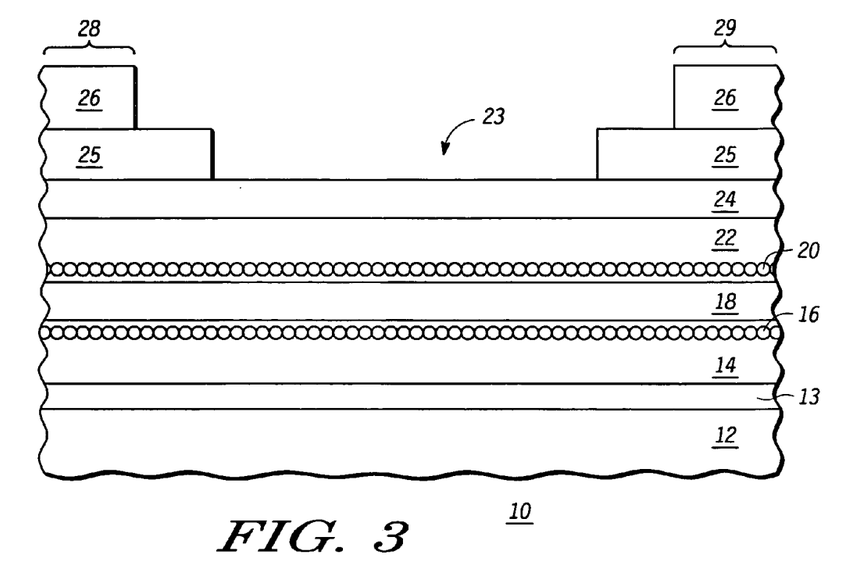
Figure 4:
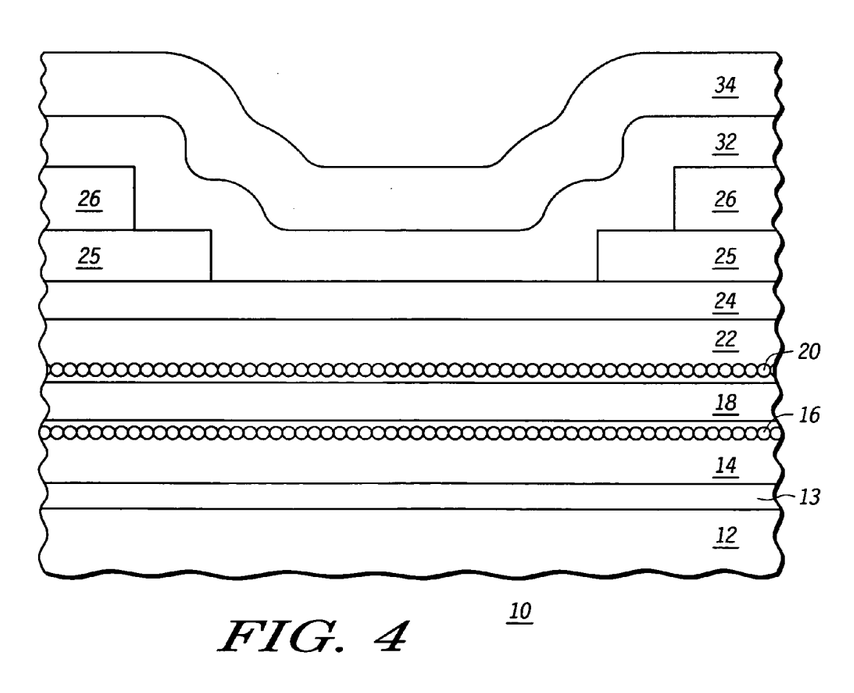

Illustrated in FIG. 3 is further processing of transistor 10 wherein a second recess 23 is formed within the second recess layer 25. The second recess 23 is typically formed by conventional wet chemical etching technology. The width of the second recess 23 is chosen to provide adequate breakdown voltage, BVGDO (Breakdown Voltage of Gate/Drain in the Off state), of the transistor 10 while not degrading transistor performance by making the length too wide. In one embodiment, the second recess 23 is approximately one to five microns in width. As shown in FIG. 3, the source region 28 and the drain region 29 are the areas under the first recess layer 26 and runs vertically from the barrier layer 22 to the first Illustrated in FIG. 4 is further processing of the transistor 10 wherein a dielectric layer 32 is provided overlying the NID layer 24 within the recesses 27 and 23, and overlying the source and drain regions 28 and 29. In one form, the dielectric layer 32 is $Si_xN_y$; any other material may be used. In one embodiment, the first dielectric layer is approximately 100 to 2000 Angstroms (10–200 nanometers). In illustrated form in FIGS. 1–9, the dielectric layer 32 is a step gate dielectric. An interlevel dielectric layer 34 having a thickness approximately 500–20,000 Angstroms (50 to 2,000 nanometers) is formed overlying the dielectric layer 32. In one form the interlevel dielectric layer 34 is formed of $SiO_2$. As will be detailed below, the dielectric layer 32 and the interlevel dielectric layer 34 function, in part, to define the gate's (control electrode's) physical dimensions.

Figure 5:
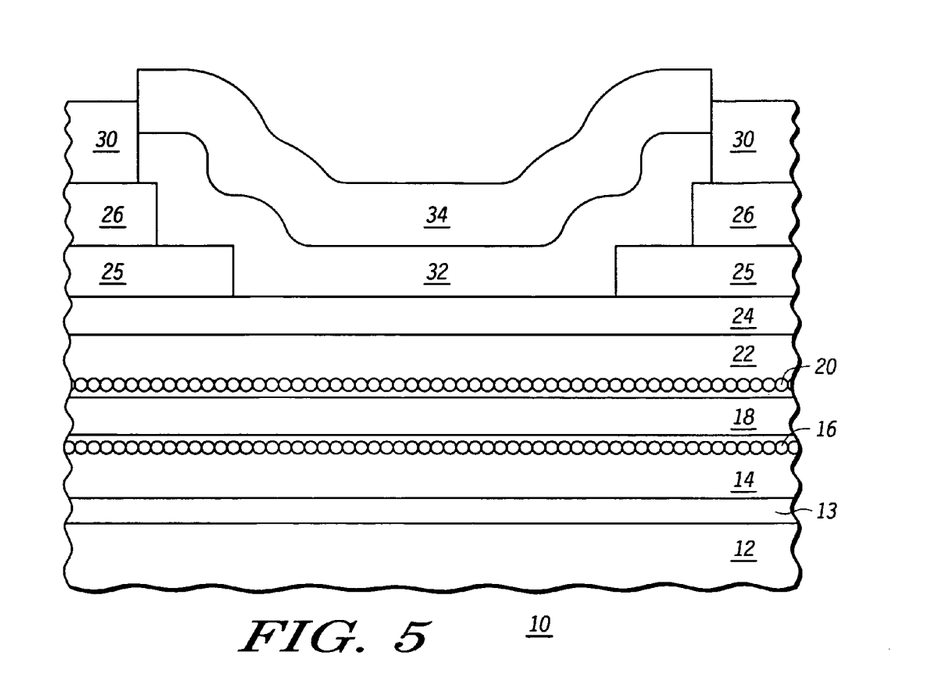

Illustrated in FIG. 5 is further processing of the transistor 10 wherein a portion of the dielectric layer 32 and the interlevel dielectric layer 34 are etched to create an opening (not shown) for the formation of source/drain (S/D) ohmic contacts 30. The source/drain (S/D) ohmic contacts 30 are deposited on and overlie the source region 28 and the drain region 29 (FIG. 2), respectively. In one embodiment, the source/drain ohmic contacts 30 are formed by depositing a layered structure of Ni, Ge and Au. This structure is then annealed to form a eutectic that penetrates into the source region 28 and the drain region 29 to complete formation of the S/D ohmic contacts 30. It should be apparent that layers of metals other than Ni, Ge, and Au may be used. In the illustrated form, the left-most contact of S/D ohmic contacts 30 is a source, and the right-most contact of S/D ohmic contacts 30 is a drain; however, the configuration can be switched.

Figure 6:
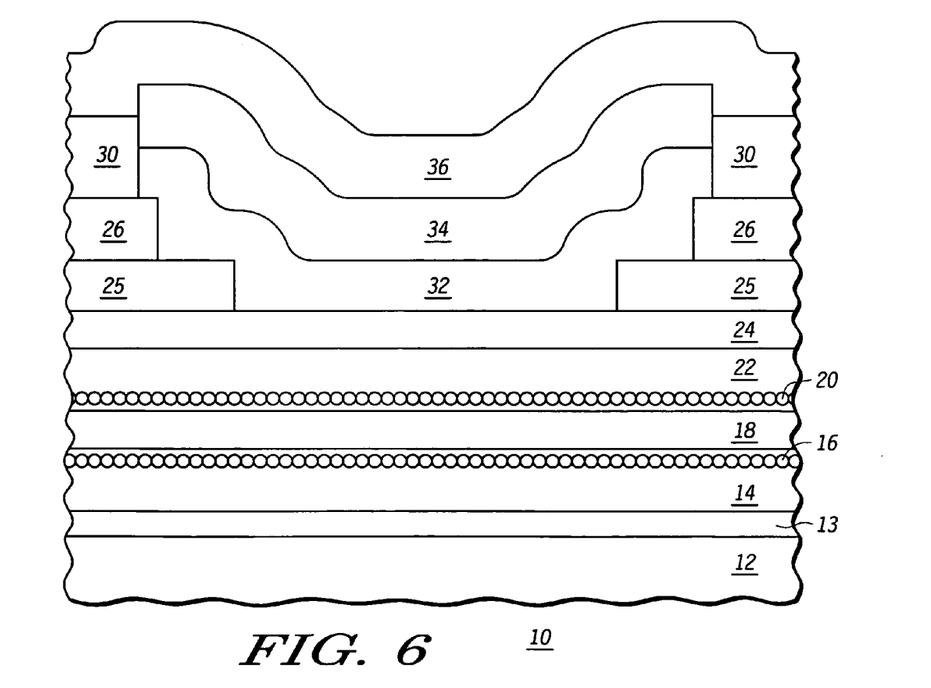

Illustrated in FIG. 6 is further processing of the transistor 10 wherein a top dielectric layer 36 is formed overlying and on the interlevel dielectric layer 34 and the S/D ohmic contacts 30. It should be well understood that the interlevel dielectric layer 34 and the top dielectric layer 36 may merge since, in one embodiment, they are the same material and therefore the boundary between the two regions that were formed separately in time may not be easily detectable.

Figure 7:
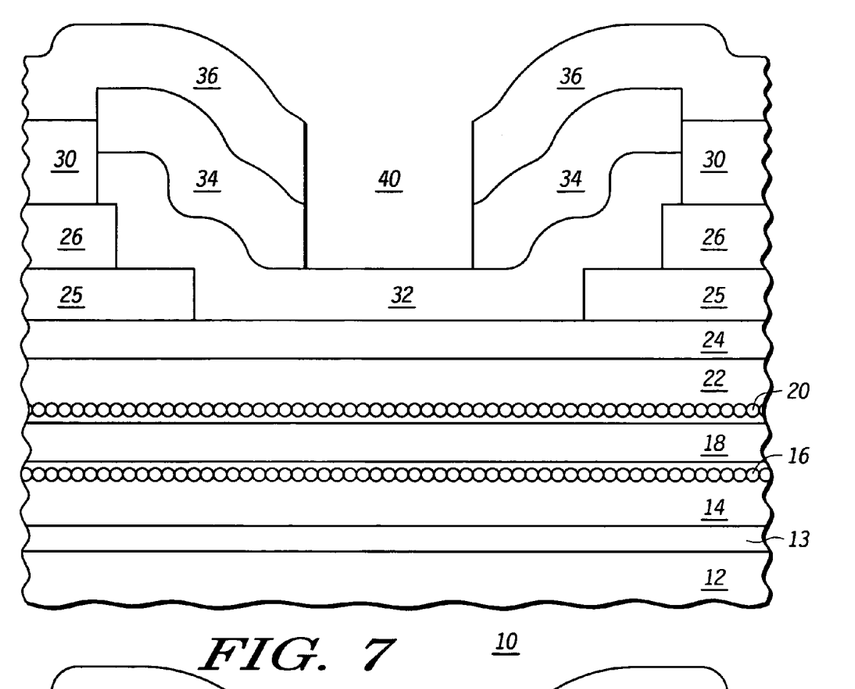

Illustrated in FIG. 7 is further processing of the transistor 10 wherein a step gate opening 40 is formed in portions of both the top dielectric layer 36 and the interlevel dielectric layer 34 that are within the recesses 23 and 27 (FIGS. 2 and 3). The step gate opening 40 is formed between the source/drain ohmic contacts 30. Various conventional techniques may be used to implement an etch stop layer (not shown) that may be used to determine the point at which an etch operation is concluded without etching into the dielectric layer 32. For example, a thin AlN layer (not shown) may be inserted between the dielectric layer 32 and the interlevel dielectric layer 34 to function as an etch stop layer.

Figure 8:
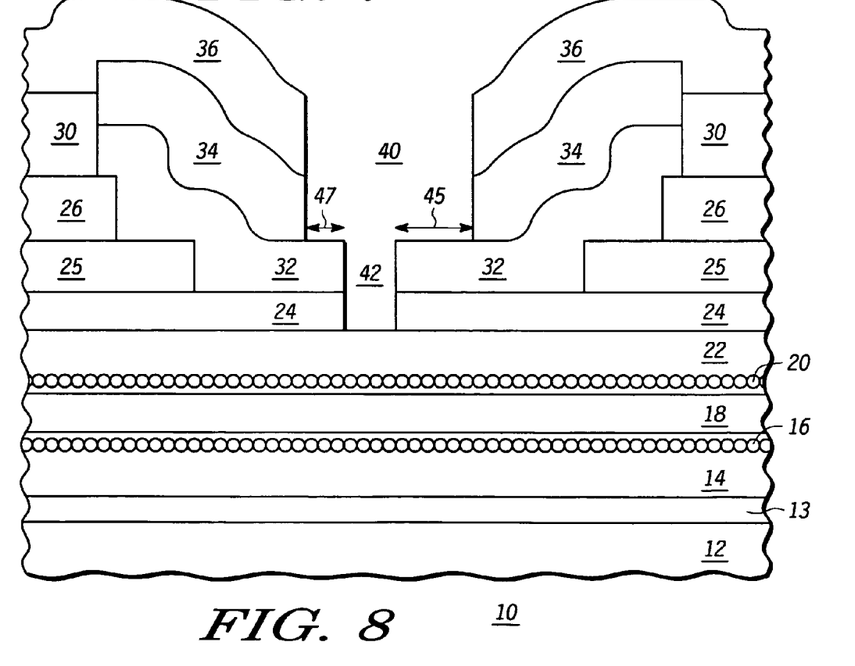

Illustrated in FIG. 8 is further processing of the transistor 10 wherein a Schottky gate region defined by a Schottky gate opening 42 is formed below the step gate opening 40 and extends through the dielectric layer 32 and the NID layer 24. To form the Schottky gate opening 42, the third recess layer 24 is recessed. The forming of the Schottky gate opening 42 includes at least defining a drain step gate length 45 that is illustrated in FIG. 8 to the right side of the Schottky gate opening 42. The drain step gate length 45 increases device breakdown voltage and reduces gate leakage current to the channel by extending the depletion region under the subsequently formed high conductivity gate 44. The drain step gate length 45 is on the order of 0.5 to 1.5 µm. Other ranges may be used depending upon a thickness of the dielectric layer 32 and the NID layer 24. To the left side of the Schottky gate opening 42 is a source side step gate length 47. The source side step gate length 47 is smaller than the drain step gate length 45. The source side step gate length 47 is limited by the ability to align with the step gate opening 40 and, for example, is on the order of 0.1 to 0.3 µm. The source side step gate length 47 is made smaller to minimize additional gate capacitance.

Figure 9:
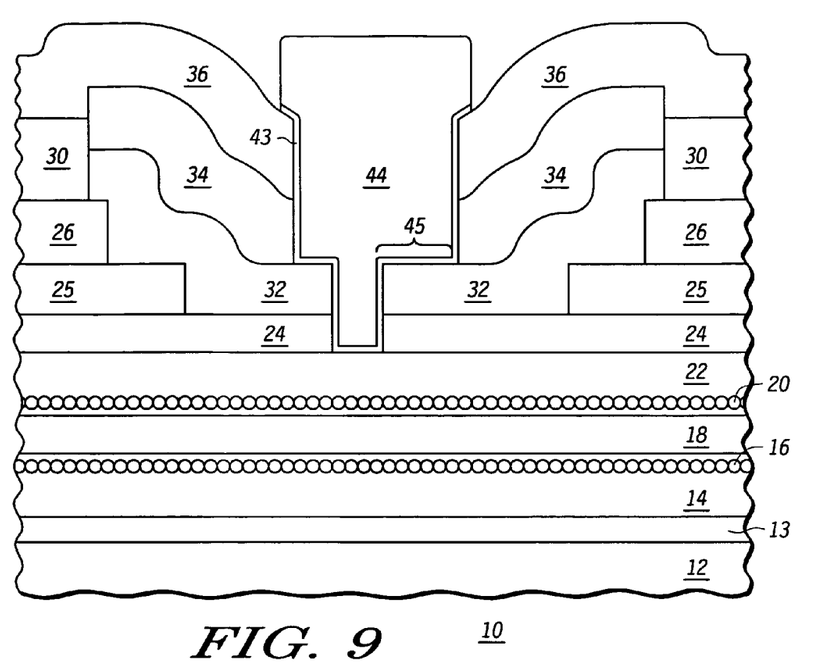

Illustrated in FIG. 9 is further processing of the transistor 10 wherein a barrier metal layer 43 and a high conductivity gate 44 are formed over the transistor 10. In one embodiment, the barrier metal layer 43 is blanket deposited over the transistor 10. In one form, the barrier metal layer 43 is TiWN or other materials such as TiPtAu. The barrier metal layer 43 covers sidewalls of the step gate opening 40.

A mask (not shown), such as a photoresist, is provided to allow the formation of a metal, such as Au, within the step gate opening 40 (FIG. 8). The metal formation may be implemented in any of numerous ways including metal plating, evaporation, or any other deposition process. The formation of the metal provides a high conductivity gate 44 in FIG. 9 that extends above an upper surface of the top dielectric layer 36. In one embodiment, the high conductivity gate 44 is a Schottky gate. Upon formation of the high conductivity gate 44, exposed portions of the barrier metal layer 43 are etched away so that only the portion of barrier metal layer 43 that is between the high conductivity gate 44 and the high conductivity gate's 44 surrounding materials is left. The barrier metal layer 43 prevents the high conductivity gate 44 from diffusing into any of the barrier layer 22, the NED layer 24, the dielectric layer 32, the interlevel dielectric layer 34, and the top dielectric layer 36. In addition, the portions of the high conductivity gate 44 that overlie the top dielectric layer 36 and are outside the step gate opening 40 (FIG. 7) may be removed.

Further conventional processing may be continued. For example, it should be noted that electrical interconnect to each of the S/D ohmic contacts 30 is made by any of numerous conventional techniques. For example in one form, a via (not shown) formed through the top dielectric layer 36 may be made to each of the source/drain ohmic contacts 30. In another form, interconnects that are perpendicular to the plane of view in FIG. 9 may be used to make electrical connection to each of the S/D ohmic contacts 30.

If the portion 45 of the high conductivity gate 44 is not on the dielectric layer 32, the depletion region can still be extended by forming a field plate 50. FIGS. 10–15 illustrate a process for forming a transistor similar to that in FIGS. 1–9 but that includes a field plate 50.

Figure 10:
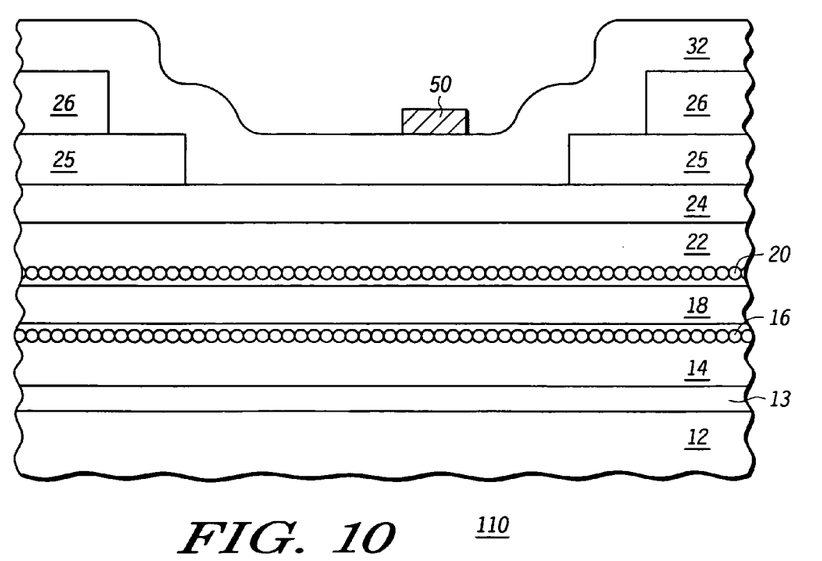
FIGS. 10–15 illustrate in cross-sectional form a process for forming a recessed, field plate, high voltage tolerant transistor and associated structures.

Illustrated in FIG. 10 is a cross-section of an incomplete transistor 110 in accordance with the present invention. A process for forming the transistor 110 is illustrated by the progression of FIGS. 10–15. The transistor 110 is exemplary of a variety of types of transistors, such as microwave field effect transistors and pseudo-morphic high electron mobility transistors.

The transistor 110 includes the substrate 12, the buffer layer 13, the backside barrier layer 14, the overlying channel layer 18, the barrier layer 22, and the Not Intentionally Doped (NID) layer 24. Overlying the NID layer 24 is the layer 25, which is the second recess layer 25 because it is patterned after the first recess layer 26. In one embodiment, the layer 25 is another NID layer. Both the first recess layer 26 and the second recess layer 25 have already been recessed to form openings (not shown) in FIG. 10 using processes previously discussed, such as a conventional wet etch process. Formed within the openings of the first recess layer 26 and the second recess layer 25 is the dielectric layer 32. Up to this point, the processing is similar, if not identical, to that of FIGS. 1–4.

A field plate 50 is formed over the dielectric layer 32 and the opening in the second recess layer 25, which is now filled with the dielectric layer 32. The field plate electrode 50 can be any conductive material and, preferably, is the same material as that of a subsequently formed highly conductive gate. In one embodiment, the field plate electrode 50 is titanium tungsten, titanium gold, titanium platinum gold, the like, or combinations of the above. The field plate electrode 50 can be formed by any method. In one embodiment, a conductive layer is formed by deposition, such as chemical vapor deposition (CVD), physical vapor deposition (PVD), atomic layer deposition (ALD), electroless plating, electroplating, the like, and combinations of the above. The conductive layer is then patterned, for example by etching or lift-off, to form the field plate electrode 50. The purpose of forming the field plate electrode 50 will be explained after further processing is discussed.

Figure 11:
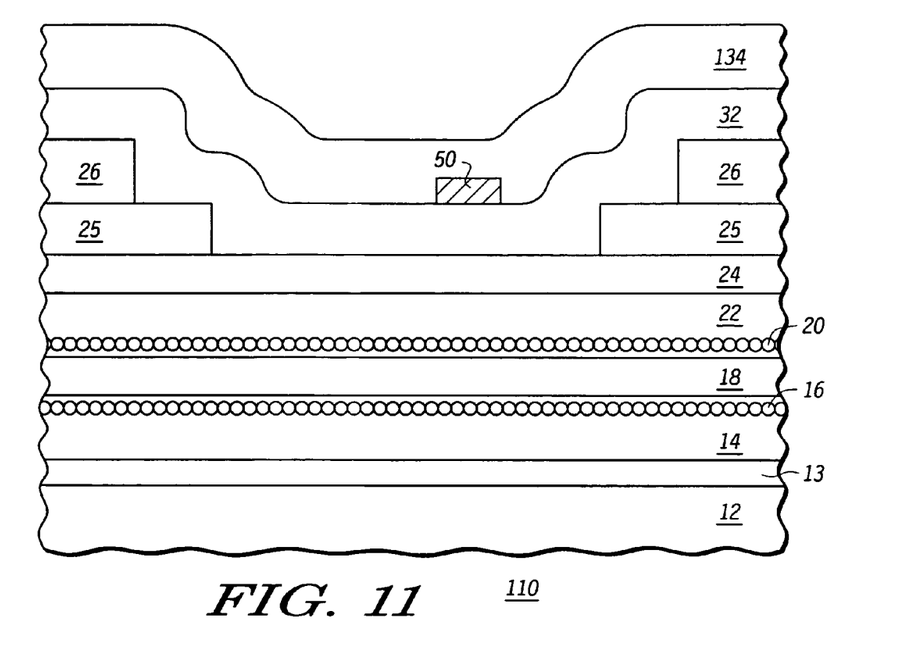

Illustrated in FIG. 11, after forming the field plate electrode 50, an interlevel dielectric layer 134 is formed over the dielectric layer 32. The interlevel dielectric layer 134 can be any material discussed for the interlevel dielectric 34.

Figure 12:
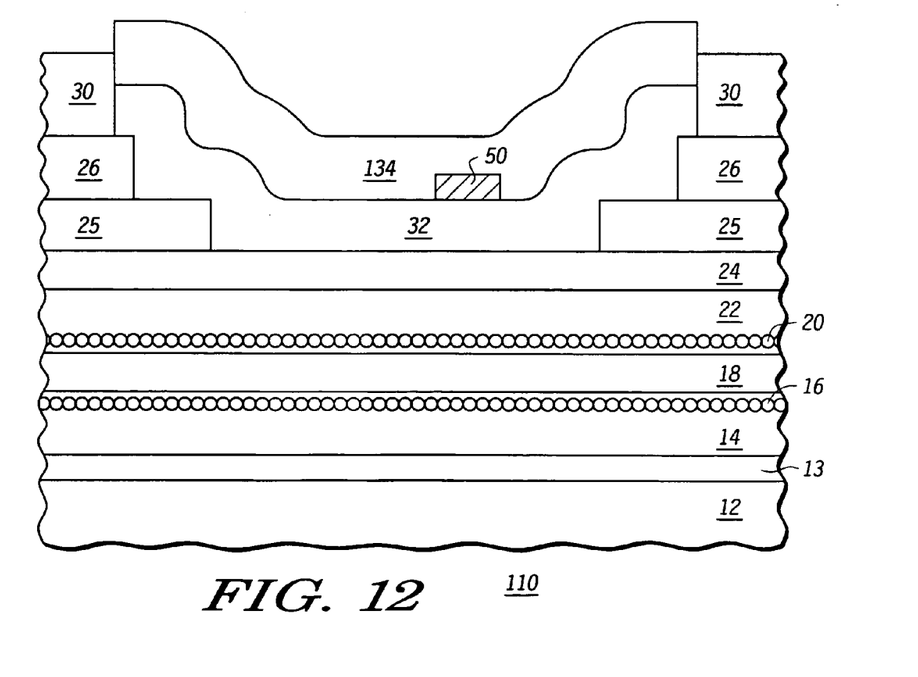

Illustrated in FIG. 12, source/drain (S/D) ohmic contacts 30 are formed after forming the interlevel dielectric layer 134. The dielectric layer 32 and the interlevel dielectric layer 134 are etched to form to create an opening (not shown) for the formation of source/drain (S/D) ohmic contacts 30. Like in FIG. 5, the S/D ohmic contacts 30 are deposited on and overlie the source region and the drain region, respectively. In the illustrated form, the left-most contact of S/D ohmic contacts 30 is a source, and the right-most contact of S/D ohmic contacts 30 is a drain; however, the configuration can be switched.

Figure 13:
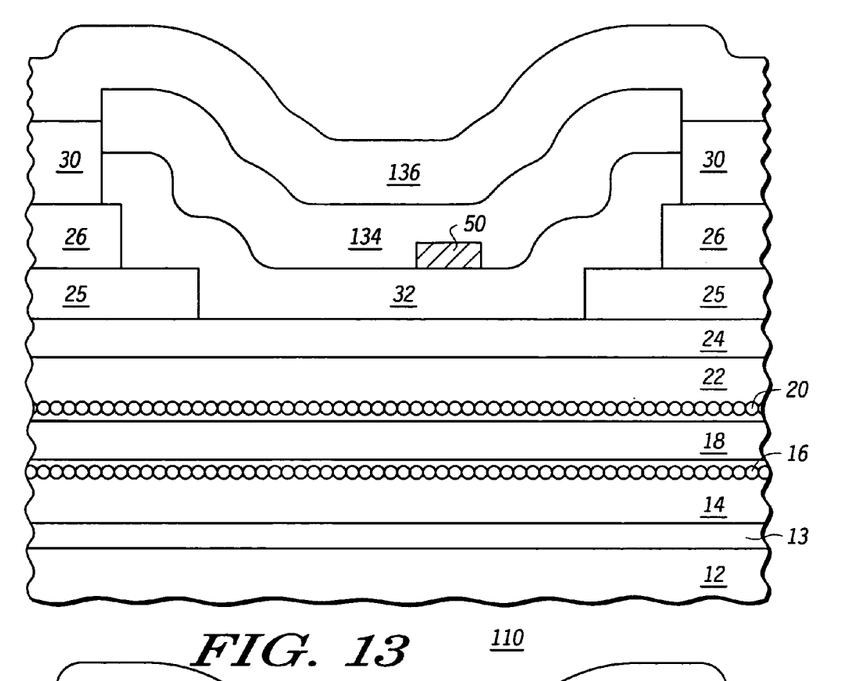

Illustrated in FIG. 13, a top dielectric layer 136 is formed overlying and on the interlevel dielectric layer 134 and the S/D ohmic contacts 30. The top dielectric layer 136 is similar to the top dielectric layer 36 in FIG. 6 and may be any material discussed for the top dielectric layer 36. It should be well understood that the interlevel dielectric layer 134 and the top dielectric layer 136 may merge since, in one embodiment, they are the same material and therefore the boundary between the two regions that were formed separately in time may not be easily detectable.

Figure 14:
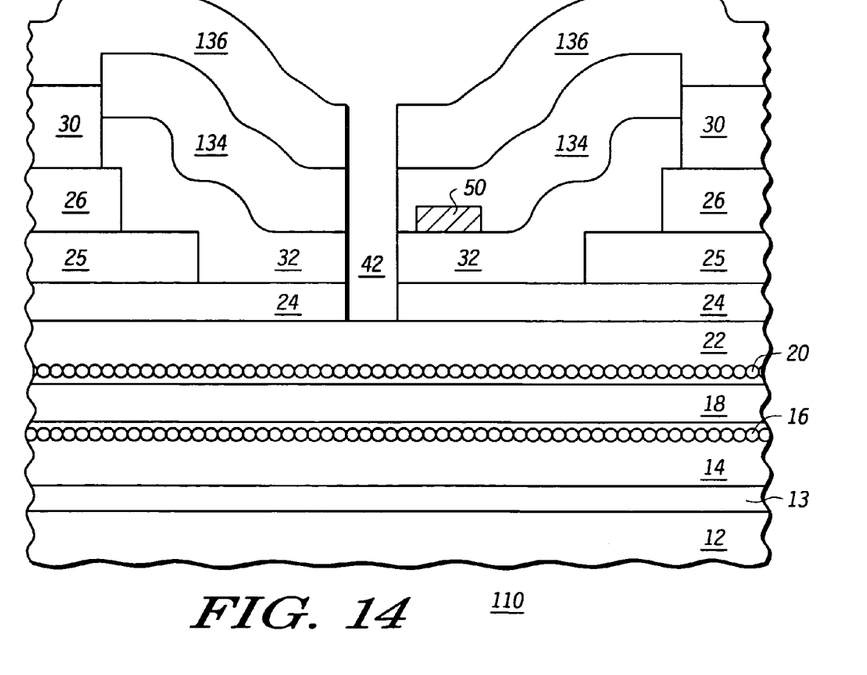

Illustrated in FIG. 14 is further processing of the transistor 110 wherein a Schottky gate region defined by a Schottky gate opening 142 is formed in the top dielectric layer 136, the interlevel dielectric layer 134, the dielectric layer 32, and the NID layer 24. To form the Schottky gate opening 142, the third recess layer 24 is recessed.

Figure 15:
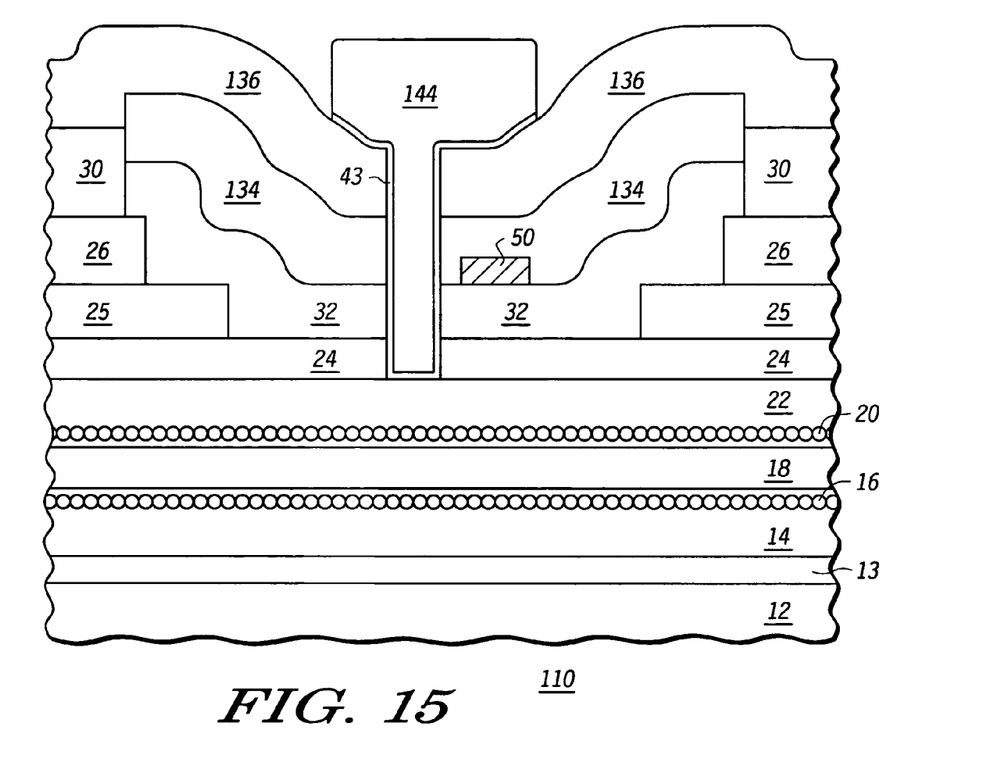

Illustrated in FIG. 15 is further processing of the transistor 110 wherein a barrier metal layer 143 and a high conductivity gate 144 are formed over the transistor 110 and within the Schottky gate opening 142. The high conductivity gate 144, which in one embodiment is the Schottky gate, can be any material taught for the high conductivity gate 44 and the barrier metal layer 143 can be any material taught for the barrier metal layer 43. In contrast to FIG. 8, there is no source or drain step gate length because the high conductivity gate 144 does not have a portion that extends beyond the Schottky gate opening 142 and lies on the dielectric layer 32. For example, in the embodiment illustrated the high conductive gate 144 is "T"-shaped and the top portion of the "T does not lie on the dielectric layer 32.

A field plate 50 can be used to help extend the depletion region during operation due to its proximity to the high conductivity gate 144. In one form, the field plate 50 is an electrode. In one embodiment, the field plate 50 is approximately 0 to 0.4 microns from the high conductivity gate 144 measuring from the right sidewall of the high conductivity gate 144 to the left sidewall of the field plate 50. Through subsequent processing known to a skilled artisan, such as the formation of metal lines, the field plate 50 can be electrically coupled to the high conductivity gate 144.

Alternatively, through subsequent processing known to a skilled artisan, such as the formation of metal lines, the field plate electrode 50 can be electrically coupled to ground, as taught in patent U.S. Pat. No. 5,119,149. This is beneficial to RF operations. Thus, the presence of the field plate 50 adds flexibility to the transistor 110 because the structure can be used to electrically couple the field plate 50 to either the high conductivity gate 144 or ground.

The above description is not intended to define the scope of the invention. Rather, the scope of the invention is defined in the claims below. The above description is intended to describe at least one exemplary embodiment of the invention and to identify at least some exemplary variations thereof. Thus, other embodiments of the invention include other variations, modifications, additions, and/or improvements to the above description. Accordingly, the specification and figures are to be regarded in an illustrative rather than a restrictive sense, and variations are intended to be included within the scope of the claimed invention.

Because the above detailed description is exemplary, when "one embodiment" is described, it is an exemplary embodiment. Accordingly, the use of the word "one" in this context is not intended to indicate that one and only one embodiment may have a described feature. Rather, many other embodiments may, and often do, have the described feature of the exemplary "one embodiment." Thus, as used above, when the invention is described in the context of one embodiment, that one embodiment is one of many possible embodiments of the invention.

Based on the teachings herein, those skilled in the art will readily implement the steps necessary to provide the structures and methods disclosed herein, and will understand that the process parameters, materials, dimensions, and sequence of steps are given by way of example only and can be varied to achieve the desired structure as well as modifications that are within the scope of the invention. Variations and modifications of the embodiments disclosed herein may be made based on the description set forth herein, without departing from the scope of the invention as set forth in the following claims.

While particular embodiments of the present invention have been shown and described, it will be obvious to those skilled in the art that, based upon the teachings herein, various modifications, alternative constructions, and equivalents may be used without departing from the invention claimed herein. For example, various materials may be used for the substrate and insulating layers. Consequently, the appended claims encompass within their scope all such changes, modifications, etc. as are within the true spirit and scope of the invention. Furthermore, it is to be understood that the invention is solely defined by the appended claims.

What is claimed is:

1. A method of forming a semiconductor structure comprising:
   forming a first semiconductor layer;
   forming a second semiconductor layer over the first semiconductor layer;
   recessing the second semiconductor layer with respect to the first semiconductor layer;
   forming a third semiconductor layer on the second semiconductor layer;
   recessing the third semiconductor layer with respect to the second semiconductor layer;
   forming a fourth semiconductor layer on the third semiconductor layer;
   recessing the fourth semiconductor layer with respect to the third semiconductor layer;
   forming a barrier layer coupled to the first semiconductor layer after recessing the fourth semiconductor layer;
   forming a first conductive portion coupled to the first semiconductor layer after forming the barrier layer; and
   forming a second conductive portion over the first semiconductor layer.

2. The method of claim 1, further comprising:
   patterning the second semiconductor layer to form an opening, wherein a portion of the first conductive portion is within the opening.

3. The method of claim 1, wherein forming the first conductive portion and the second conductive portion occur simultaneously.

4. The method of claim 1, wherein forming the first conductive portion occurs after forming the second conductive portion.

5. The method of claim 1, wherein forming the second conductive portion comprises forming a field plate over the first semiconductor layer.

6. The method of claim 1, wherein forming the second conductive portion comprises forming the second conductive portion over the second semiconductor layer.

7. The method of claim 1, wherein forming the second conductive portion comprises physically isolating the second conductive portion from the first semiconductor layer, the second semiconductor layer, and the third semiconductor layer.

8. The method of claim 1, further comprising forming a dielectric over the first semiconductor layer and laterally adjacent the third semiconductor layer.

9. A method of forming a semiconductor structure comprising:
   forming a first semiconductor layer;
   forming a second semiconductor layer over the first semiconductor layer; recessing the second semiconductor layer with respect to the first semiconductor layer;
   forming a third semiconductor layer over the second semiconductor layer;
   recessing the third semiconductor layer with respect to the second semiconductor layer;
   forming a fourth semiconductor layer over the third semiconductor layer;
   recessing the fourth semiconductor layer with respect to the third semiconductor layer;
   forming a control electrode coupled to the first semiconductor layer; and
   forming a conductive portion over the first semiconductor layer, wherein the conductive portion is different than the control electrode and wherein forming the conductive portion comprises forming a field plate over the first semiconductor layer.

10. The method of claim 9, further comprising:
    patterning the second semiconductor layer to form an opening, wherein a portion of the control electrode is within the opening.

11. The method of claim 9, wherein forming the control electrode occurs after forming the conductive portion.

12. The method of claim 9, wherein forming the conductive portion comprises forming the conductive portion over the second semiconductor layer.

* * * * *